United States Patent
Zhou et al.

(10) Patent No.: US 6,641,430 B2
(45) Date of Patent: Nov. 4, 2003

(54) CONTACT STRUCTURE AND PRODUCTION METHOD THEREOF AND PROBE CONTACT ASSEMBLY USING SAME

(75) Inventors: Yu Zhou, Vernon Hills, IL (US); David Yu, Bloomingdale, IL (US); Robert Edward Aldaz, Carol Stream, IL (US); Theodore A. Khoury, Evanston, IL (US)

(73) Assignee: Advantest Corp., Tokyo (JP)

( * ) Notice: Subject to any disclaimer, the term of this patent is extended or adjusted under 35 U.S.C. 154(b) by 0 days.

(21) Appl. No.: 10/014,630

(22) Filed: Dec. 8, 2001

(65) Prior Publication Data

US 2002/0123252 A1 Sep. 5, 2002

Related U.S. Application Data

(63) Continuation-in-part of application No. 09/733,508, filed on Dec. 9, 2000, now Pat. No. 6,471,538, which is a continuation-in-part of application No. 09/503,903, filed on Feb. 14, 2000, now Pat. No. 6,540,524.

(51) Int. Cl.[7] .............................................. H01R 13/00
(52) U.S. Cl. ...................................................... 439/482
(58) Field of Search ................................ 439/482, 591, 439/862, 65, 66, 79, 81, 91; 324/754

(56) References Cited

U.S. PATENT DOCUMENTS

| 4,177,425 A | * 12/1979 | Lenz |
| 4,585,727 A | * 4/1986 | Reams |
| 5,199,889 A | 4/1993 | McDevitt, Jr. |
| 5,772,451 A | 6/1998 | Dozier, II et al. |
| 5,800,184 A | 9/1998 | Lopergolo et al. |
| 5,919,050 A | 7/1999 | Kehley et al. |
| 5,926,951 A | 7/1999 | Khandros et al. |

* cited by examiner

Primary Examiner—Khiem Nguyen
(74) Attorney, Agent, or Firm—Muramatsu & Associates

(57) ABSTRACT

A contact structure for establishing electrical connection with contact targets. The contact structure is formed of a contactor carrier and a plurality of contactors attached to a contactor adapter. The contactor adapter is inserted in a slot of the contactor carrier, thereby locking the contactors on the contactor carrier. The contactor has an upper end having a cut-out to engage fit in contactor adapter, a lower end oriented in a direction opposite to the upper end and functions as a contact point for electrical connection with a contact target, and a diagonal portion provided between the upper end and the lower end to function as a spring.

18 Claims, 17 Drawing Sheets

Fig. 3
(Prior Art)
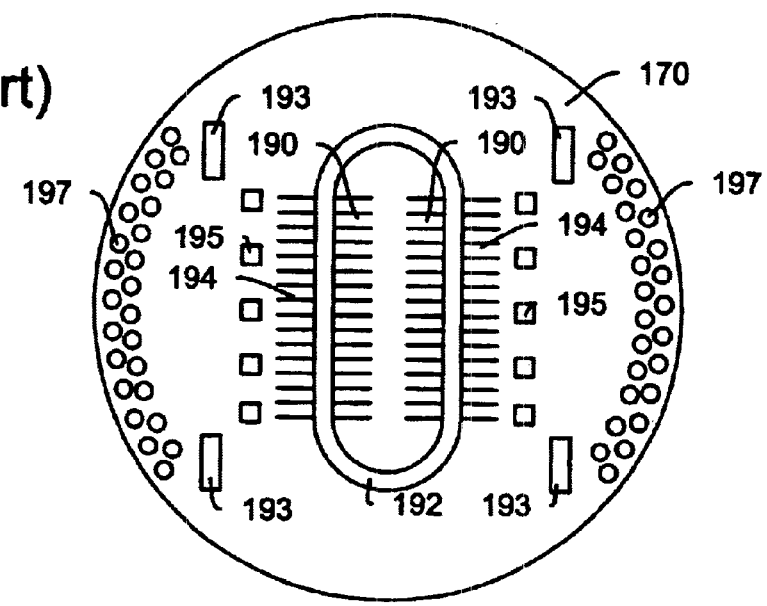
Fig. 4A
(Prior Art)
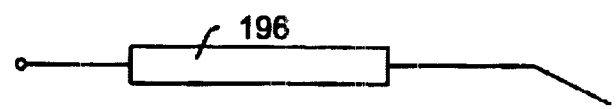
Fig. 4B
(Prior Art)
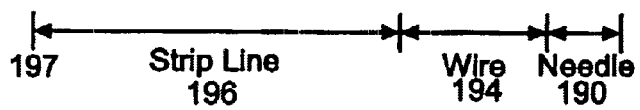
Fig. 4C
(Prior Art)
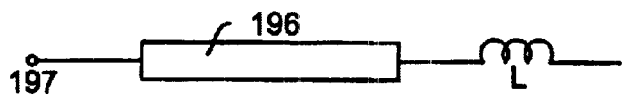
Fig. 4D
(Prior Art)
Fig. 4E
(Prior Art)
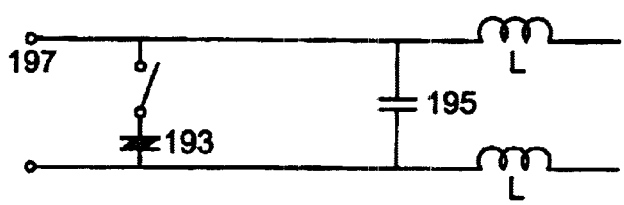

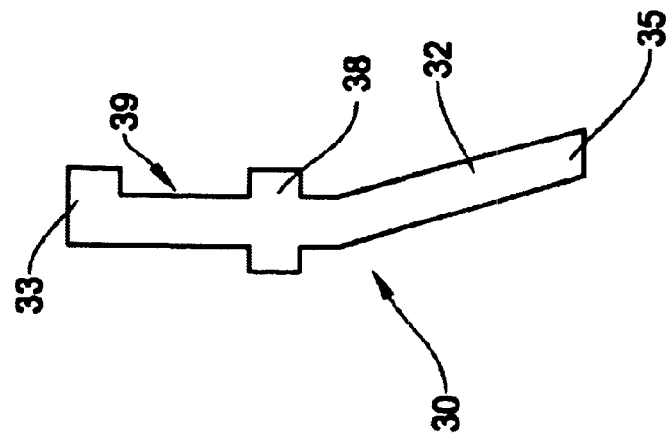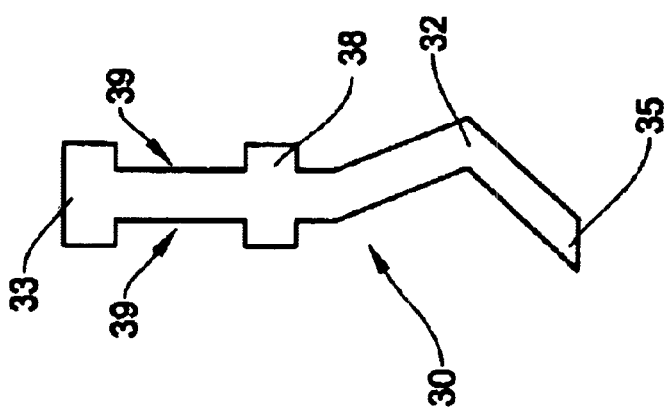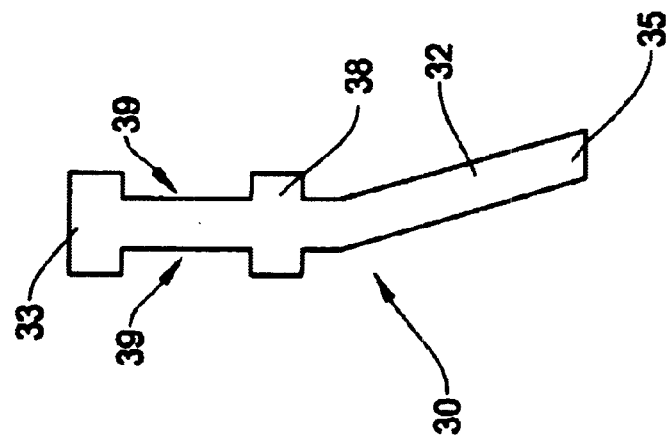

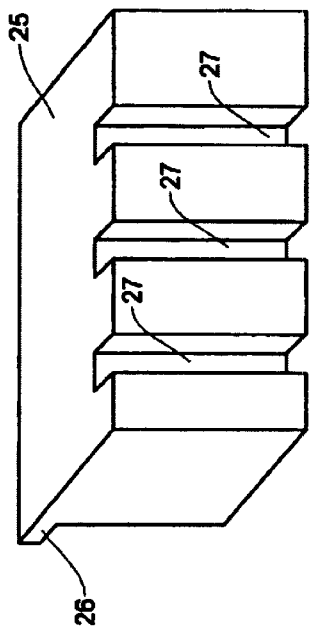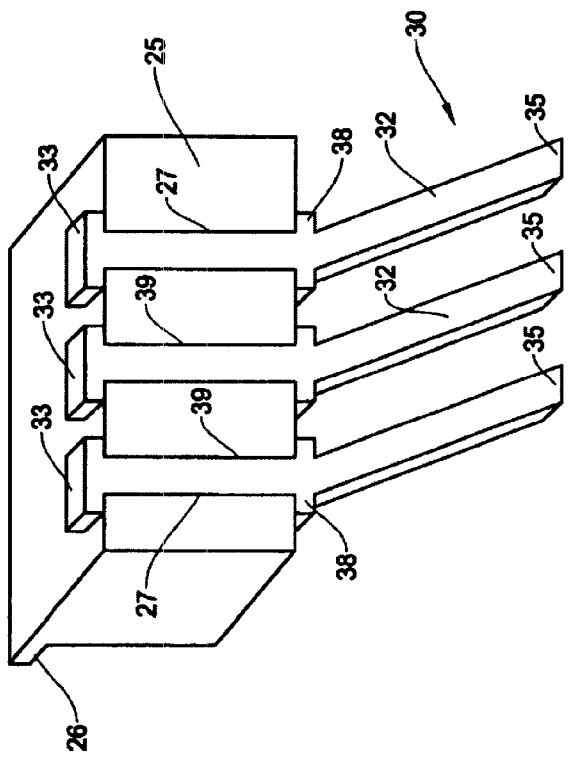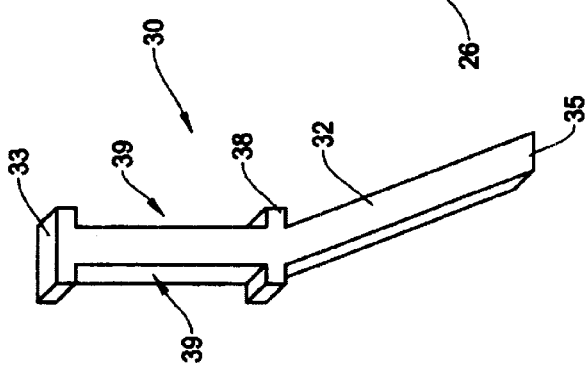

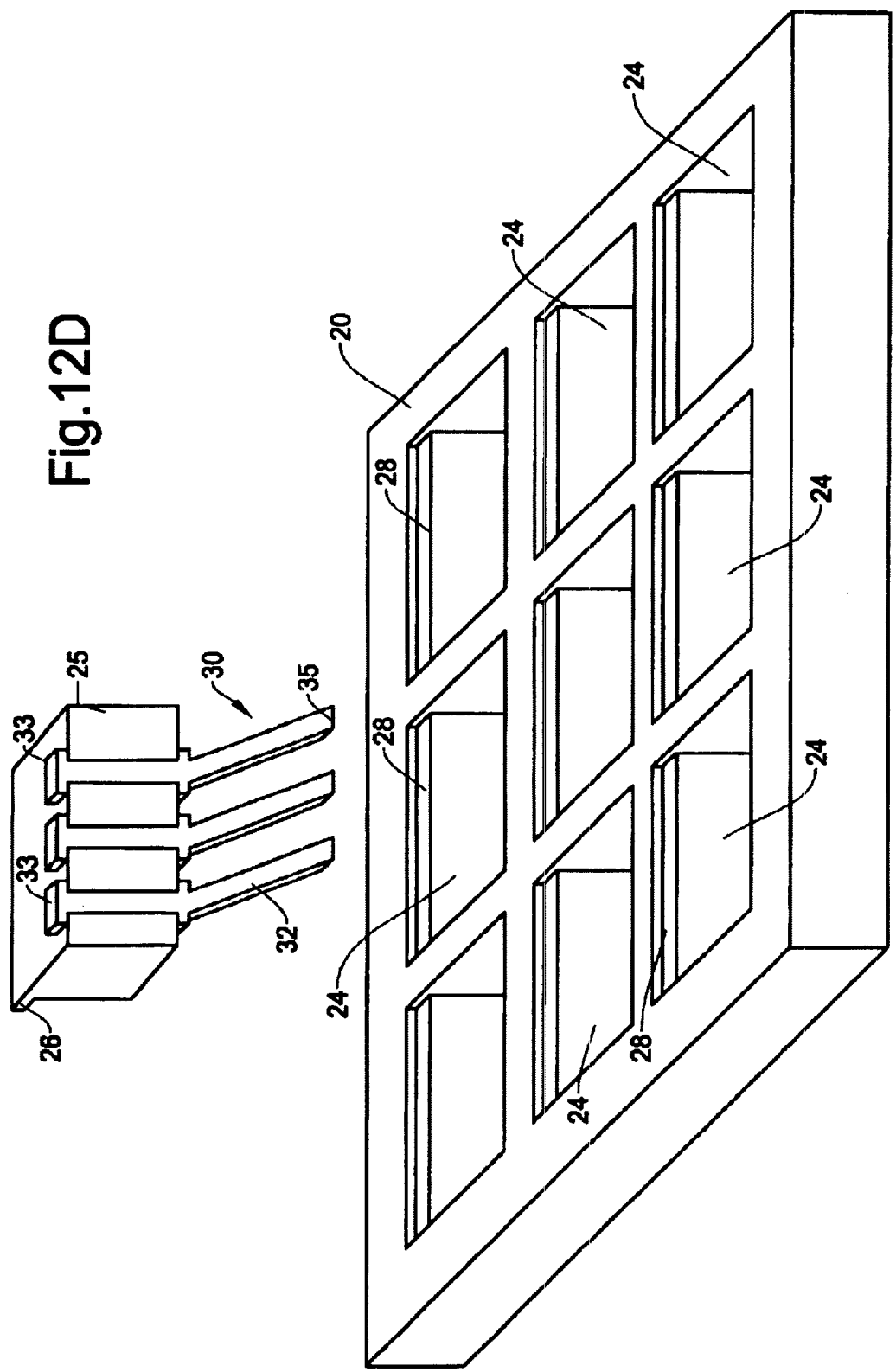

CONTACT STRUCTURE AND PRODUCTION METHOD THEREOF AND PROBE CONTACT ASSEMBLY USING SAME

This is a continuation-in-part of U.S. patent application No. 09/733,508 filed Dec. 9, 2000, now U.S. Pat. No. 6,471,538, which is a continuation-in-part of U.S. patent application No. 09/503,903 filed Feb. 14, 2000, now U.S. Pat. No. 6,540,524.

FIELD OF THE INVENTION

This invention relates to a contact structure and a production method thereof and a probe contact assembly using the contact structure, and more particularly, to a contact structure having a large number of contactors in a vertical direction and to a method for producing such a large number of contactors on a semiconductor wafer in a horizontal direction and removing the contactors from the wafer to be mounted on a substrate in a vertical direction to form the contact structure such as a contact probe assembly, probe card, IC chip, or other contact mechanism.

BACKGROUND OF THE INVENTION

In testing high density and high speed electrical devices such as LSI and VLSI circuits, a high performance contact structure such as a probe card having a large number of contactors must be used. In other applications, contact structures may be used for IC packages as IC leads.

The present invention is directed to a structure and production process of such contact structures for use in testing and burning-in LSI and VLSI chips, semiconductor wafers and dice, packaged semiconductor devices, printed circuit boards and the like. The present invention can also be applied to other purposes such as forming leads or terminal pins of IC chips, IC packages or other electronic devices. However, for the simplicity and convenience of explanation, the present invention is described mainly with respect to the semiconductor wafer testing.

In the case where semiconductor devices to be tested are in the form of a semiconductor wafer, a semiconductor test system such as an IC tester is usually connected to a substrate handler, such as an automatic wafer prober, to automatically test the semiconductor wafer. Such an example is shown in FIG. 1 in which a semiconductor test system has a test head 100 which is ordinarily in a separate housing and electrically connected to the test system with a bundle of cables 110. The test head 100 and a substrate handler 400 are mechanically as well as electrically connected with one another with the aid of a manipulator 500 which is driven by a motor 510. The semiconductor wafers to be tested are automatically provided to a test position of the test head 100 by the substrate handler 400.

On the test head 100, the semiconductor wafer to be tested is provided with test signals generated by the semiconductor test system. The resultant output signals from the semiconductor wafer under test (IC circuits formed on the semiconductor wafer) are transmitted to the semiconductor test system. In the semiconductor test system, the output signals from the wafer are compared with expected data to determine whether the IC circuits on the semiconductor wafer function correctly.

Referring to FIGS. 1 and 2, the test head 100 and the substrate handler 400 are connected through an interface component 140 consisting of a performance board 120 which is a printed circuit board having electric circuit connections unique to a test head's electrical footprint, coaxial cables, pogo-pins and connectors. The test head 100 includes a large number of printed circuit boards 150 which correspond to the number of test channels (test pins) of the semiconductor test system. Each of the printed circuit boards 150 has a connector 160 to receive a corresponding contact terminal 121 of the performance board 120.

A "frog" ring 130 is mounted on the performance board 120 to accurately determine the contact position relative to the substrate handler 400. The frog ring 130 has a large number of contact pins 141, such as ZIF connectors or pogo-pins, connected to contact terminals 121, through coaxial cables 124.

As shown in FIG. 2, the test head 100 is positioned over the substrate handler 400 and connected to the substrate handler through the interface component 140. In the substrate handler 400, a semiconductor wafer 300 to be tested is mounted on a chuck 180. In this example, a probe card 170 is provided above the semiconductor wafer 300 to be tested. The probe card 170 has a large number of probe contactors (such as cantilevers or needles) 190 to contact with contact targets such as circuit terminals or pads in the IC circuit on the semiconductor wafer 300 under test.

Electrodes (contact pads) of the probe card 170 are electrically connected to the contact pins 141 provided on the frog ring 130. The contact pins 141 are also connected to the contact terminals 121 of the performance board 120 through the coaxial cables 124 where each contact terminal 121 is connected to the corresponding printed circuit board 150 of the test head 100. Further, the printed circuit boards 150 are connected to the semiconductor test system through the cable 110 having, for example, several hundreds of inner cables.

Under this arrangement, the probe contactors (needles) 190 contact the surface (contact target) of the semiconductor wafer 300 on the chuck 180 to apply test signals to the semiconductor wafer 300 and receive the resultant output signals from the wafer 300. As noted above, the resultant output signals from the semiconductor wafer 300 under test are compared with the expected data generated by the semiconductor test system to determine whether the IC circuits on the semiconductor wafer 300 performs properly.

FIG. 3 is a bottom view of the probe card 170 of FIG. 2. In this example, the probe card 170 has an epoxy ring on which a plurality of probe contactors 190 called needles or cantilevers are mounted. When the chuck 180 mounting the semiconductor wafer 300 moves upward in FIG. 2, the tips of the probe contactors 190 contact the pads or bumps (contact targets) on the wafer 300. The ends of the needles 190 are connected to wires 194 which are further connected to transmission lines (not shown) formed on the probe card 170. The transmission lines are connected to a plurality of electrodes (contact pads) 197 which are in communication with the pogo pins 141 of FIG. 2.

Typically, the probe card 170 is structured by a multi-layer of polyimide substrates having ground planes, power planes, signal transmission lines on many layers. As is well known in the art, each of the signal transmission lines is designed to have a characteristic impedance such as 50 ohms by balancing the distributed parameters, i.e., dielectric constant and magnetic permeability of the polyimide, inductances and capacitances of the signal paths within the probe card 170. Thus, the signal lines are impedance matched establishing a high frequency transmission bandwidth to the wafer 300 for supplying currents in a steady state as well as high current peaks generated by the device's outputs switching in a transient state. For removing noise, capacitors 193 and 195 are provided on the probe card between the power and ground planes.

An equivalent circuit of the probe card 170 is shown in FIG. 4. As shown in FIGS. 4A and 4B, the signal transmission line on the probe card 170 extends from the electrode 197, the strip (impedance matched) line 196, the wire 194, to the contactor 190. Since the wire 194 and needle 190 are not impedance matched, these portions are deemed as an inductor L in the high frequency band as shown in FIG. 4C. Because of the overall length of the wire 194 and contactor 190 is around 20–30 mm, significant limitations will be resulted from the inductor when testing a high frequency performance of a device under test.

Other factors which limit the frequency bandwidth in the probe card 170 reside in the power and ground contactors shown in FIGS. 4D and 4E. If the power line can provide large enough currents to the device under test, it will not seriously limit the operational bandwidth in testing the device. However, because the series connected wire 194 and needle 190 for supplying the power (FIG. 4D) as well as the series connected wire 194 and needle 190 for grounding the power and signals (FIG. 4E) are equivalent to inductors, the high speed current flow is seriously restricted.

Moreover, the capacitors 193 and 195 are provided between the power line and the ground line to secure a proper performance of the device under test by filtering out the noise or surge pulses on the power lines. The capacitors 193 have a relatively large value such as 10 $\mu$F and can be disconnected from the power lines by switches if necessary. The capacitors 195 have a relatively small capacitance value such as 0.01 $\mu$F and fixedly connected close to the DUT. These capacitors serve the function as high frequency decoupling on the power lines. In other words, the capacitors limit the high frequency performance of the probe contactor.

Accordingly, the most widely used probe contactors as noted above are limited to the frequency bandwidth of approximately 200 MHz which is insufficient to test recent semiconductor devices. In the industry, it is considered that the frequency bandwidth on the order of 1 GHz or higher, will be necessary in the near future. Further, it is desired in the industry that a probe card is capable of handling a large number of semiconductor devices, especially memories, such as 32 or more, in a parallel fashion to increase test throughput.

In the conventional technology, the probe card and probe contactors such as shown in FIG. 3 are manually made, resulting in inconsistent quality. Such inconsistent quality includes fluctuations of size, frequency bandwidth, contact forces and resistance, etc. In the conventional probe contactors, another factor making the contact performance unreliable is a temperature change under which the probe contactors and the semiconductor wafer under test have different temperature expansion ratios. Thus, under the varying temperature, the contact positions therebetween vary which adversely affects the contact force, contact resistance and bandwidth. Thus, there is a need of a contact structure with a new concept which can satisfy the requirement in the next generation semiconductor test technology.

SUMMARY OF THE INVENTION

Therefore, it is an object of the present invention to provide a contact structure having a large number of contactors for electrically contacting with contact targets with high frequency bandwidth, high pin count and contact performance as well as high reliability.

It is another object of the present invention to provide a contact structure formed of a contactor carrier and a plurality of contactors where the contactors are easily and securely mounted on the contactor carrier with use of a contactor adapter.

It is a further object of the present invention to provide a contact structure such as a probe card for use in testing semiconductor devices and the like which has a very high frequency bandwidth to meet the test requirements in the next generation semiconductor test technology.

It is a further object of the present invention to provide a contact structure to establish electrical connection with a large number of semiconductor devices for testing such semiconductor devices in parallel at the same time.

It is a further object of the present invention to provide a method for producing a large number of contactors in a two dimensional manner on a silicon substrate, removing the contactors from the substrate and mounting the contactors on a contact substrate in a three dimensional manner to form a contact structure.

In the present invention, a contact structure is formed of a large number of contactors and a contactor carrier. The contactors are produced on a planar surface of a base substrate such as a silicon substrate by a photolithography technology and removed from the substrate and mounted on the contactor carrier. The contact structure of the present invention is advantageously applied to testing and burning-in semiconductor devices, such as LSI and VLSI chips, semiconductor wafers and dice, packaged ICs, printed circuit boards and the like. The contact structure of the present invention can also be used as components of electronics devices such as IC leads and pins.

The first aspect of the present invention is a contact structure for establishing electrical connection with contact targets. The contact structure is formed of a contactor carrier and a plurality of contactors. The contactors are mounted on the contactor carrier through a contactor adapter. The contactor has an upper end oriented in a vertical direction, a lower end which functions as a contact point for electrical connection with a contact target, a diagonal beam portion provided between the upper end and the lower end to function as a spring.

Another aspect of the present invention is a method of producing the contactors in a two dimensional manner on a silicon substrate and removing therefrom for establishing a contact structure. The production method is comprised of the following steps of:

(a) forming a sacrificial layer on a surface of a silicon substrate;

(b) forming a photoresist layer on the sacrificial layer;

(c) aligning a photo mask over the photoresist layer and exposing the photoresist layer with ultraviolet light through the photo mask, the photo mask including an image of the contactors;

(d) developing patterns of the image of the contactors on a surface of the photoresist layer;

(e) forming the contactors made of conductive material in the patterns on the photoresist layer by depositing the conductive material, each of the contactors having an upper end with a cut-out for fitting in a contactor adapter, a lower end to function as a contact point, and a diagonal beam provided between the upper end and the lower end to function as a spring;

(f) stripping the photoresist layer off;

(g) removing the sacrificial layer by an etching process so that the contactors are separated from the silicon substrate; and (h) fitting the cut-outs of the contactors in grooves formed on the contactor adapter.

(i) mounting the contactor adapter having the contactors on a contactor carrier through a predetermined slot formed on the contactor carrier.

A further aspect of the present invention is a probe contact assembly including the contact structure of the present invention. The probe contact assembly is formed of a contactor carrier having a plurality of contactors mounted thereon through a contactor adapter, a probe card for mounting the contactor carrier and establishing electrical communication between the contactors and electrodes provided on the probe card, and a pin block having a plurality of contact pins to interface between the probe card and a semiconductor test system when the pin block is attached to the probe card. Each contactor has a structure as described above with respect to the first aspect of the present invention.

According to the present invention, the contact structure has a very high frequency bandwidth to meet the test requirements of the next generation semiconductor technology. The contactors are easily and securely mounted on the contactor carrier with use of the unique mounting structure. Since the large number of contactors are produced at the same time on the substrate without involving manual handling, it is possible to achieve consistent quality, high reliability and long life in the contact performance as well as low cost. Further, because the contactors are assembled on the same substrate material as that of the device under test, it is possible to compensate positional errors caused by temperature changes.

Further, according to the present invention, the production process is able to produce a large number of contactors in a horizontal direction on the silicon substrate by using relatively simple technique. Such contactors are removed from the substrate and mounted on a contact substrate in a vertical direction then assembled by simply inserting the middle portion into the carrier. The contact structure produced by the present invention is low cost and has high efficiency while achieving high mechanical strength and reliability.

BRIEF DESCRIPTION OF THE DRAWINGS

FIG. 3 is a bottom view showing an example of the probe card having an epoxy ring for mounting a plurality of probe contactors in the conventional technology.

FIGS. 4A–4E are circuit diagrams showing equivalent circuits of the probe card of FIG. 3.

FIGS. 7A–7C are front views showing examples of structure of the contactors of the present invention.

FIGS. 12A–12D are perspective views showing the contact structure of the present invention in which FIG. 12A shows the contactor, FIG. 12B shows the contactor adapter, FIG. 12C shows the contactor adapter with the contactors mounted thereon, and FIG. 12D shows the contactor carrier for mounting the contactor adapter of FIG. 12C.

DETAILED DESCRIPTION OF THE INVENTION

The present invention will now be explained in detail with reference to FIGS. 5–14. It should be noted that the description of the present invention includes such terms as "horizontal" and "vertical". These terms are used to describe relative positional relationship of the components associated with the present invention. Therefore, the interpretation of the terms "horizontal" and "vertical" should not be limited to absolute meanings.

Figure 5:
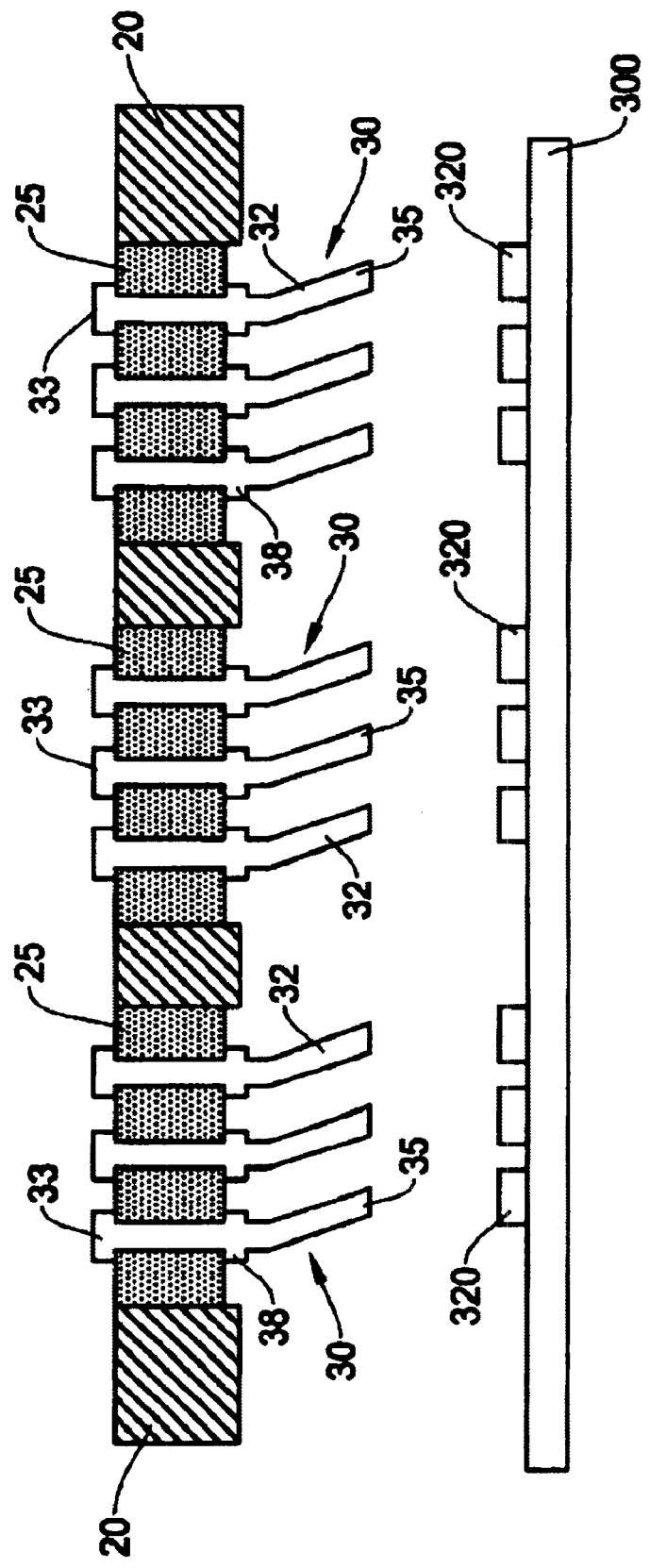
FIG. 5 is a cross sectional view showing an example of contact structure of the present invention including the contactors, contactor carrier and contactor adapter.

FIG. 5 is a cross sectional view showing an example of contact structure of the present invention. The contact structure is configured by a contactor carrier 20, a contactor adapter 25, and a plurality of contactors 30. In an application of semiconductor test, the contact structure is positioned, for example, over a semiconductor device such as a silicon wafer 300 to be tested. When the silicon wafer 300 is moved upward, the lower ends of the contactors 30 contact with contact pads 320 on the semiconductor wafer 300 to establish electrical communication therebetween.

The contactor carrier 20 and the contactor adapter 25 are made of silicon or dielectric material such as polyimide, ceramic and glass. The contactors 30 are made of conductive material or coated with conductive material. Two or more contactors 30 are attached to the contactor adapter 25 and the contactor adapter 25 is attached to the contactor carrier 20. Two or more contactor adapters 25 each carrying a plurality of contactors 30 are attached to the contactor carrier 20, more details of which will be described later with reference to FIGS. 12A–12D.

In FIG. 5, each contactor 30 is composed of an upper end (base portion) 33, a diagonal (spring) portion 32, and a lower end (contact portion) 35. A stopper 38 is provided to each contactor 30 with a predetermined distance from the upper end 33 to securely mount the contactor 30 on the contactor adapter 25. Namely, the upper end 33 and the stopper 38 form a cut-out 39 (FIGS. 7A–7C) to be fit in a groove 27 on the contactor adapter 25. In other words, the distance between the upper end 33 and the stopper 38 is formed to be about the same as the thickness of the contactor adapter 25. The cut-outs 39, the contactor adapter 25 and the contactor carrier 20 create a lock mechanism for securely and easily mounting the contactors 30 on the contactor carrier 20.

The diagonal portion 32 diagonally extends from the upper end 33 to the lower end 35. The upper end 33 and the lower end 35 function as contact points to establish electrical communication with other components. In the semiconductor test application, the upper end 33 functions to contact with a probe card of the test system and the lower end 35 functions to contact with a contact target such as the contact pad 320 on the semiconductor wafer 300.

Figure 6A:
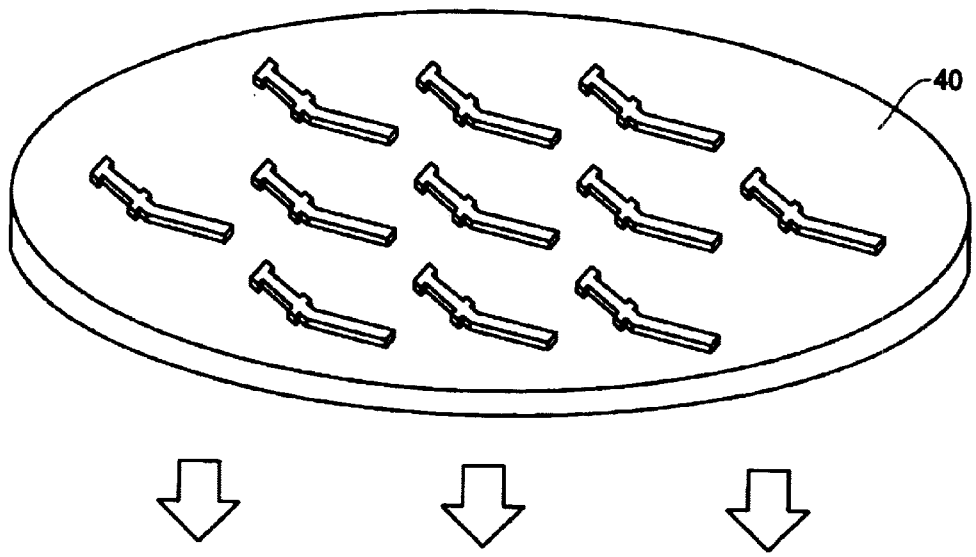
FIGS. 6A and 6B are schematic diagrams showing a basic concept of production method of the present invention in which a large number of contactors are formed on a planar surface of a substrate and removed therefrom for later processes.
Figure 6B:
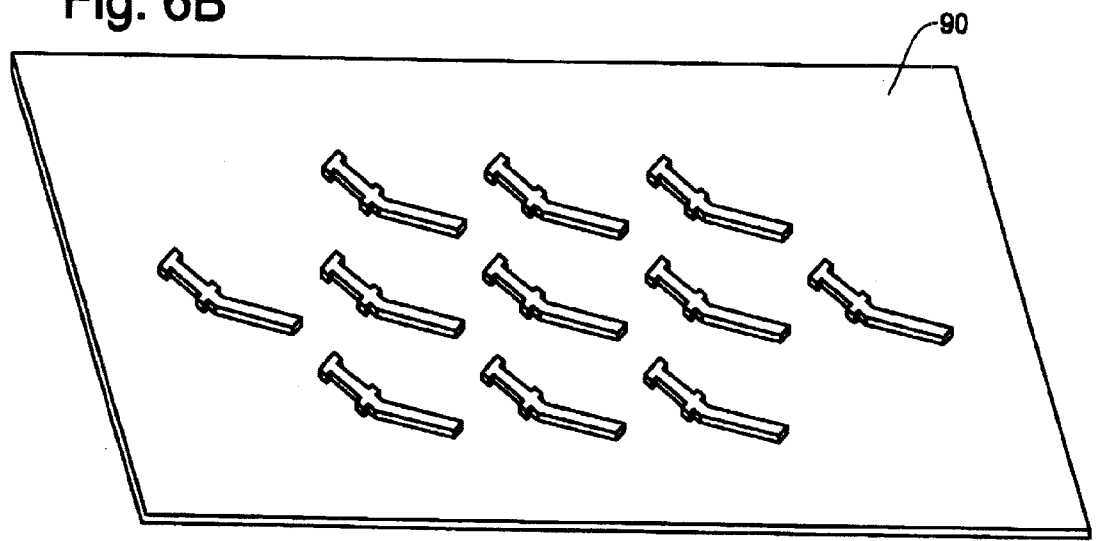

As noted above, the contactors 30 are mounted on the contactor carrier 20 via the contactor adapter 25. The upper end 33 and the lower end 35 are respectively projected from the upper surface and the lower surface of the contactor adapter 25. The diagonal (spring) portion 32 of the contactor 30 functions as a spring to produce a resilient force when the lower end 35 is pressed against the contact target such as the contact pad 320. The lower end (contact point) 35 of the contactor 30 is preferably sharpened to be able to scrub the surface of the contact pad 320. The resilient force promotes such a scrubbing effect at the lower end 35 against the surface of contact pad 320. The scrubbing effect promotes an improved contact performance when the contact point 35 scrubs the metal oxide surface layer of the contact pad 320 to electrically contact the conductive material of the contact pad 320 under the metal oxide surface layer. FIGS. 6A–6B concepts of the present inventions for producing such contactors. In the present invention, as shown in FIG. 6A, the contactors 30 are produced on a planar surface of a base substrate 40 in a horizontal direction, i.e., in parallel with a planar surface of the substrate 40. In other words, the contactors 30 are built in a two dimensional manner on the substrate 40. Then, the contactors 30 are removed from the substrate 40 to be mounted on the contactor carrier 20 shown in FIG. 5 in a vertical direction, i.e., in a three dimensional manner. Typically, the base substrate 40 is a silicon substrate although other substrate such as dielectric substrates are also feasible.

The contactors 30 produced in the manner shown in FIG. 6A are removed and directly mounted on the contactor carrier 20 shown in FIG. 5. Alternatively, in the example of FIG. 6B, the contactors 30 produced as shown in FIG. 6A are then transferred from the substrate 40 to an adhesive member 90, such as an adhesive tape, adhesive film or adhesive plate (collectively "adhesive tape"). In the further process, the contactors 30 on the adhesive tape 90 are removed therefrom to be mounted on the contactor carrier 20 of FIG. 5 in a vertical direction, i.e., in a three dimensional manner with use, for example, of a pick and place mechanism.

FIGS. 7A–7C show examples of shape of the contactor 30 of the present invention. As noted above with reference to FIG. 5, the contactor 30 has the upper end (base portion) 33, the diagonal (spring) portion 32, and the lower end (contact portion) 35. Cut-outs (indentations) 39 are formed by the upper end 33 and the stopper 38 so that the contactor 30 can snugly fit in the groove formed on the contactor adapter 25.

In the example of FIG. 7A, the diagonal portion 32 is a straight beam running in a diagonal direction to promote the spring action. In the example of FIG. 7B, the diagonal portion 32 is bent in a zig-zag fashion at the intermediate position to promote the spring action. In the example of FIG. 7C, the cut-out 39 is formed only one side of the upper portion of the contactor 30. Many other shapes of the contactor can be used in the contact structure of the present invention so long as it has a structure to be properly attached to the contactor adapter 25.

Preferably, the diagonal portion 32 has a width and/or thickness smaller than that of the upper end 33 to promote the spring action. Because of the reduced width and of the diagonal portion 32, it can easily deform when the contactor 30 is pressed against the contact target. As noted above with reference to FIG. 6A, the contactors 30 are produced on the horizontal surface of the silicon substrate in the horizontal direction. To achieve such difference in the thickness of the contactor 30, the process for depositing the conductive material will be repeated in the production process shown in FIGS. 8–10.

Figure 8A:
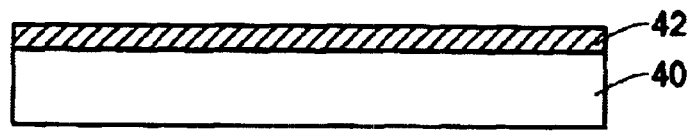
FIGS. 8A–8L are schematic diagrams showing an example of production process in the present invention for producing the contactors of the present invention.

FIGS. 8A–8L are schematic diagrams showing an example of production process for producing the contactor 30 of the present invention. In FIG. 8A, a sacrificial layer 42 is formed on a base substrate 40 which is typically a silicon substrate. Other substrate such as a glass substrate and a ceramic substrate is also feasible for this purpose. The sacrificial layer 42 is made, for example, of silicon dioxide ($SiO_2$) through a deposition process such as a chemical vapor deposition (CVD). The sacrificial layer 42 is to separate contactors 30 from the silicon substrate in the later stage of the production process.

Figure 8B:
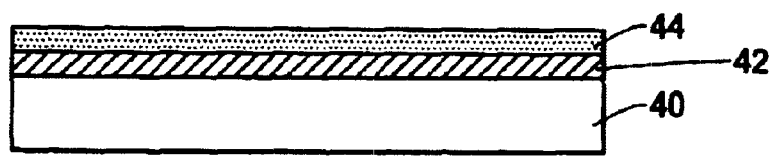
Figure 8C:
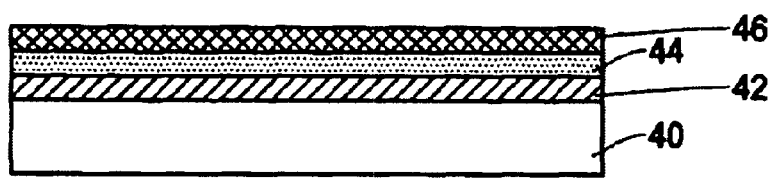

An adhesion promoter layer 44 is formed on the sacrificial layer 42 as shown in FIG. 8B through, for example, an evaporation process. An example of material for the adhesion promoter layer 44 includes chromium (Cr) and titanium (Ti) with a thickness of about 200–1,000 angstrom, for example. The adhesion promoter layer 44 is to facilitate the adhesion of conductive layer 46 of FIG. 8C on the silicon substrate 40. The conductive layer 46 is made, for example, of copper (Cu) or nickel (Ni), with a thickness of about 1,000–5,000 angstrom, for example. The conductive layer 46 is to establish electrical conductivity for an electroplating process in the later stage.

Figure 8D:
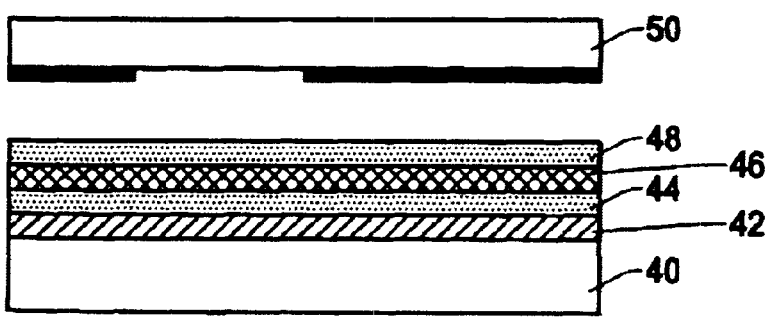
Figure 8E:
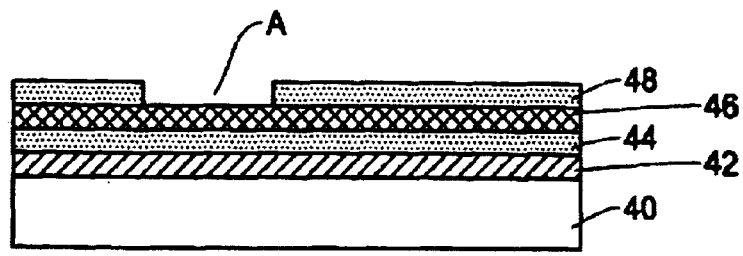
Figure 8F:
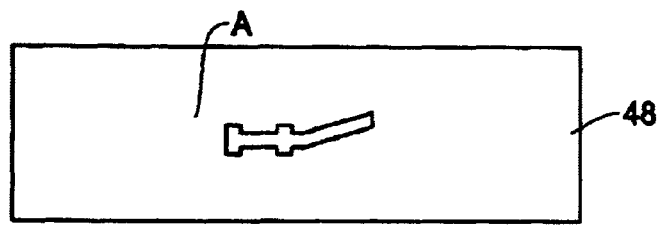

In the next process, a photoresist layer 48 is formed on the conductive layer 46 over which a photo mask 50 is precisely aligned to be exposed with ultraviolet (UV) light as shown in FIG. 8D. The photo mask 50 shows a two dimensional image of the contactor 30 which will be developed on the photoresist layer 48. As is well known in the art, positive as well as negative photoresist can be used for this purpose. If a positive acting resist is used, the photoresist covered by the opaque portions of the mask 50 hardens (cure) after the exposure. Examples of photoresist material include Novolak (M-Cresol-formaldehyde), PMMA (Poly Methyl Methacrylate), SU-8 and photo sensitive polyimide. In the development process, the exposed part of the resist can be dissolved and washed away, leaving a photoresist layer 48 of FIG. 8E having an opening or pattern "A". Thus, the top view of FIG. 8F shows the pattern or opening "A" on the photoresist layer 48 having the image (shape) of the contactor 30.

In the photolithography process in the foregoing, instead of the UV light, it is also possible to expose the photoresist layer 48 with an electron beam or X-rays as is known in the art. Further, it is also possible to directly write the image of the contact structure on the photoresist layer 48 by exposing the photoresist 48 with a direct write electron beam, X-ray or light source (laser).

Figure 8G:
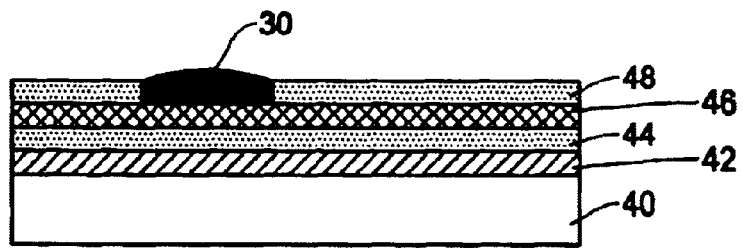
Figure 8H:
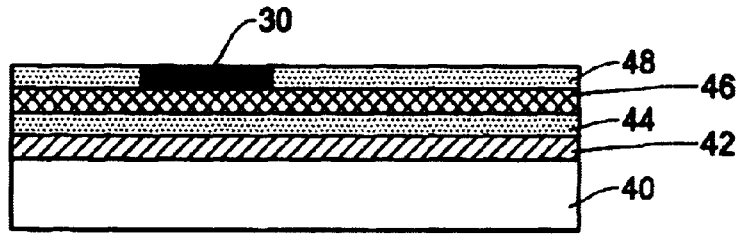

The conductive material such as copper (Cu), nickel (Ni), aluminum (Al), rhodium (Rh), palladium (Pd), tungsten (W)

or other metal, nickel-cobalt (NiCo) or other alloy combinations thereof is deposited (electroplated) in the pattern "A" of the photoresist layer 48 to form the contactor 30 as shown in FIG. 8G. Preferably, a contact material which is different from that of the conductive layer 46 should be used to differentiate etching characteristics from one another as will be described later. The over plated portion of the contactor 30 in FIG. 8G is removed in the grinding (planarizing) process of FIG. 8H.

The above noted process may be repeated for producing contactors having different thickness by forming two or more conductive layers. For example, a certain portion of the contactor 30 may be designed to have a thickness larger than that of the other portions. In such a case, after forming a first layer of the contactors (conductive material), if necessary, the processes of FIGS. 8D–8H will be repeated to form a second layer or further layers on the first layer of the contactors.

Figure 8I:
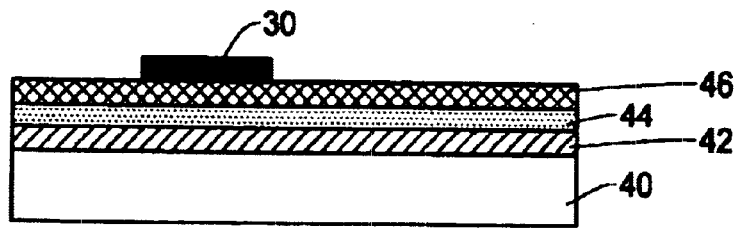
Figure 8J:
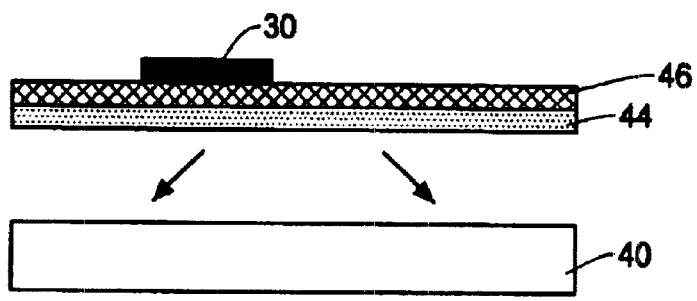
Figure 8K:
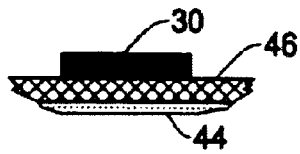
Figure 8L:
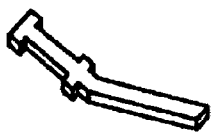

In the next process, the photoresist layer 48 is removed in a resist stripping process as shown in FIG. 8I. Typically, the photoresist layer 48 is removed by wet chemical processing. Other examples of stripping are acetone-based stripping and plasma $O_2$ stripping. In FIG. 8J, the sacrificial layer 42 is etched away so that the contactor 30 is separated from the silicon substrate 40. Another etching process is conducted so that the adhesion promoter layer 44 and the conductive layer 46 are removed from the contactor 30 as shown in FIG. 8K.

The etching condition can be selected to etch the layers 44 and 46 but not to etch the contactor 30. In other words, to etch the conductive layer 46 without etching the contactor 30, as noted above, the conductive material used for the contactor 30 must be different from the material of the conductive layer 46. Finally, the contactor 30 is separated from any other materials as shown in the perspective view of FIG. 8L. Although the production process in FIGS. 8A–8L shows only one contactor 30, in an actual production process, as shown in FIGS. 6A and 6B, a large number of contactors are produced at the same time.

FIGS. 9A–9D are schematic diagrams showing an example of production process for producing the contactors of the present invention. In this example, an adhesive tape 90 is incorporated in the production process to transfer the contactors 30 from the silicon substrate 40 to the adhesive tape. FIGS. 9A–9D only show the latter part of the production process in which the adhesive tape 90 is involved.

Figure 9A:
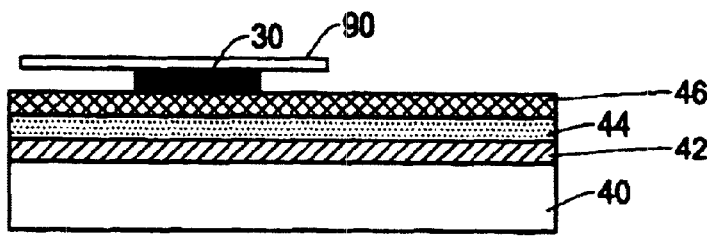
FIGS. 9A–9D are schematic diagrams showing another example of production process in the present invention for producing the contactors of the present invention.

FIG. 9A shows a process which is equivalent to the process shown in FIG. 8I where the photoresist layer 48 is removed in the resist stripping process. Then, also in the process of FIG. 9A, an adhesive tape 90 is placed on an upper surface of the contactor 30 so that the contactor 30 adheres to the adhesive tape 90. As noted above with reference to FIG. 6B, within the context of the present invention, the adhesive tape 90 includes other types of adhesive member, such as an adhesive film and adhesive plate, and the like. The adhesive tape 90 also includes any member which attracts the contactor 30 such as a magnetic plate or tape, an electrically charged plate or tape, and the like.

Figure 9B:
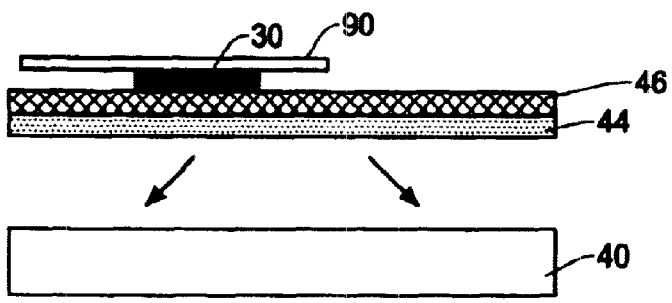
Figure 9C:
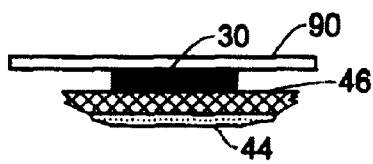
Figure 9D:
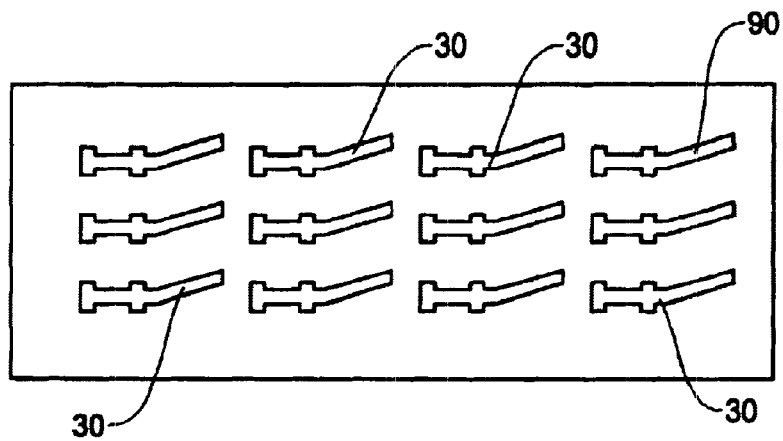

In the process shown in FIG. 9B, the sacrificial layer 42 is etched away so that the contactor 30 on the adhesive tape 90 is separated from the silicon substrate 40. Another etching process is conducted so that the adhesion promoter layer 44 and the conductive layer 46 are removed from the contactor 30 as shown in FIG. 9C.

As noted above, in order to etch the conductive layer 46 without etching the contactor 30, the conductive material used for the contactor 30 must be different from the material of the conductive layer. Although the production process in FIGS. 9A–9C shows only one contactor, in an actual production process, a large number of contactors are produced at the same time. Thus, a large number of contactors 30 are transferred to the adhesive tape 90 and separated from the silicon substrate and other materials as shown in the top view of FIG. 9D.

Figure 10A:
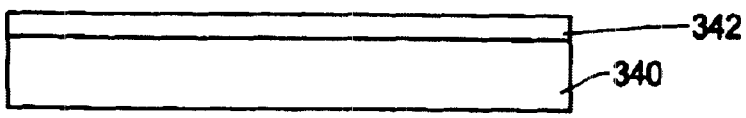
FIGS. 10A–10N are schematic diagrams showing an example of process for producing the contactors of the present invention on the surface of a substrate and transferring the contactors to an intermediate plate.
Figure 10B:

FIGS. 10A–10N are schematic diagrams showing a further example of production process for producing the contactor 30 where the contactors are transferred to the adhesive tape. In FIG. 10A, an electroplate seed (conductive) layer 342 is formed on a base substrate 340 which is typically a silicon or glass substrate. The seed layer 342 is made, for example, of copper (Cu) or nickel (Ni), with a thickness of about 1,000–5,000 angstrom, for example. A chrome-inconel layer 344 is formed on the seed layer 342 as shown in FIG. 10B through, for example, a sputtering process.

Figure 10C:
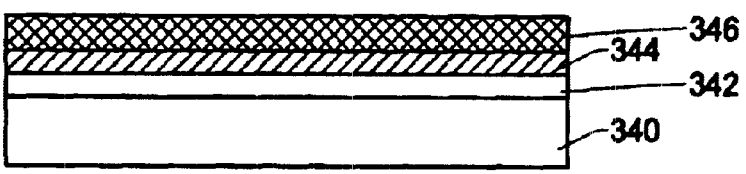
Figure 10D:
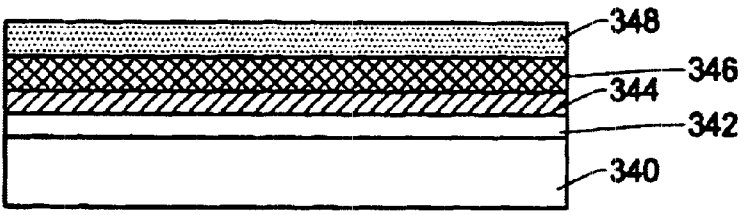
Figure 10E:
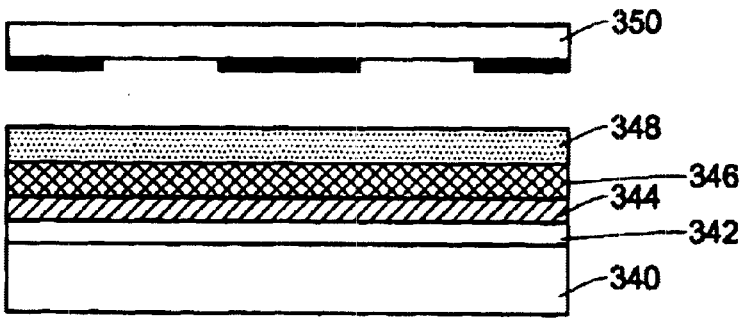

In the next process in FIG. 10C, a conductive substrate 346 is formed on the chrome-inconel layer 344. The conductive substrate 346 is made, for example, of nickel-cobalt (NiCo) with a thickness of about 100–130 micrometer. After passivating the conductive substrate 346, a photoresist layer 348 with a thickness of about 100–120 micrometer is formed on the conductive substrate 346 in FIG. 10D and a photo mask 350 is precisely aligned so that the photoresist layer 348 is exposed with ultraviolet (UV) light as shown in FIG. 10E. The photo mask 350 shows a two dimensional image of the contactor 30 which will be developed on the surface of the photoresist layer 348.

Figure 10F:
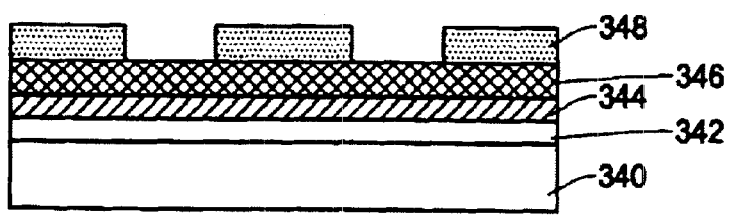
Figure 10G:
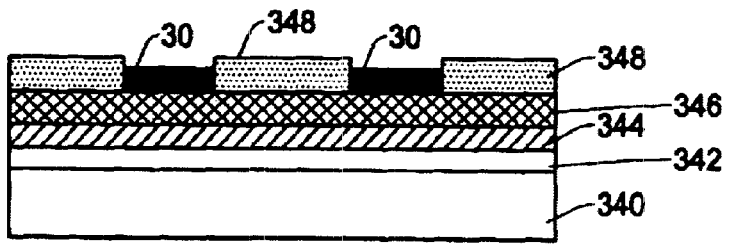

In the development process, the exposed part of the resist can be dissolved and washed away, leaving a photoresist layer 348 of FIG. 10F having a plating pattern transferred from the photo mask 350 having the image (shape) of the contactor 30. In the step of FIG. 10G, contactor material is electroplated in the plating pattern on the photoresist layer 348 with a thickness of about 50–60 micrometer. An example of the conductive material is nickel-cobalt (NiCo). The nickel-cobalt contactor material will not strongly adhere to the conductive substrate 346 made of nickel-cobalt.

In the case where the contactor has two or more different thickness, the above noted process may be repeated for producing the contactor by forming two or more conductive layers. Namely, after forming a first layer of the contactors, if necessary, the processes of FIGS. 10D–10G are repeated to form a second layer or further layers on the first layer of the contactors.

Figure 10H:
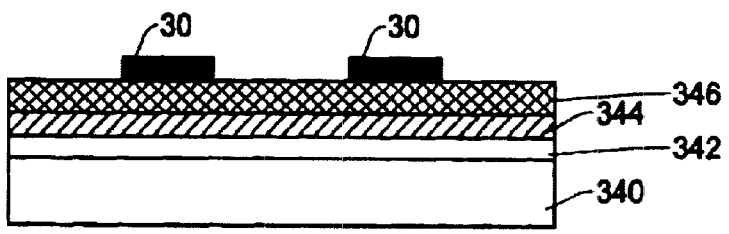
Figure 10I:
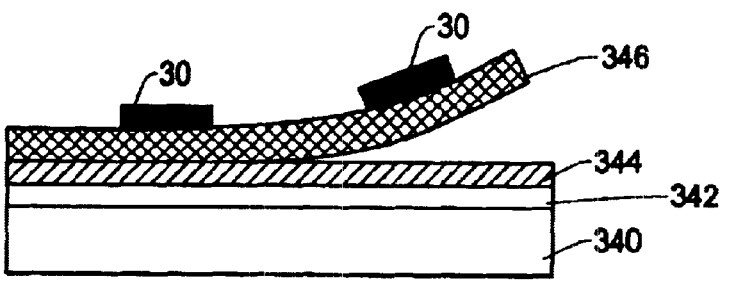
Figure 10J:
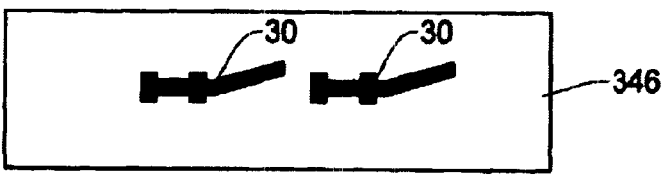

In the next process, the photoresist layer 348 is removed in a resist stripping process as shown in FIG. 10H. In FIG. 10I, the conductive substrate 346 is peeled from the chrome-inconel layer 344 on the substrate 340. The conductive substrate 346 is a thin substrate on which the contactors 30 are mounted with a relatively weak adhesive strength. The top view of the conductive substrate 346 having the contactors 30 is shown in FIG. 10J.

FIG. 10K shows a process in which an adhesive tape 90 is placed on an upper surface of the contactors 30. The adhesive strength between the adhesive tape 90 and the contactors 30 is greater than that between the contactors 30 and the conductive substrate 346. Thus, when the adhesive tape 90 is removed from the conductive substrate 346, the contactors 30 are transferred from the conductive substrate 346 to the adhesive tape 90 as shown in FIG. 10L. FIG. 10M shows a top view of the adhesive tape 90 having the contactors 30 thereon and FIG. 10N is a cross sectional view of the adhesive tape 90 having the contactors 30 thereon.

Figure 11A:
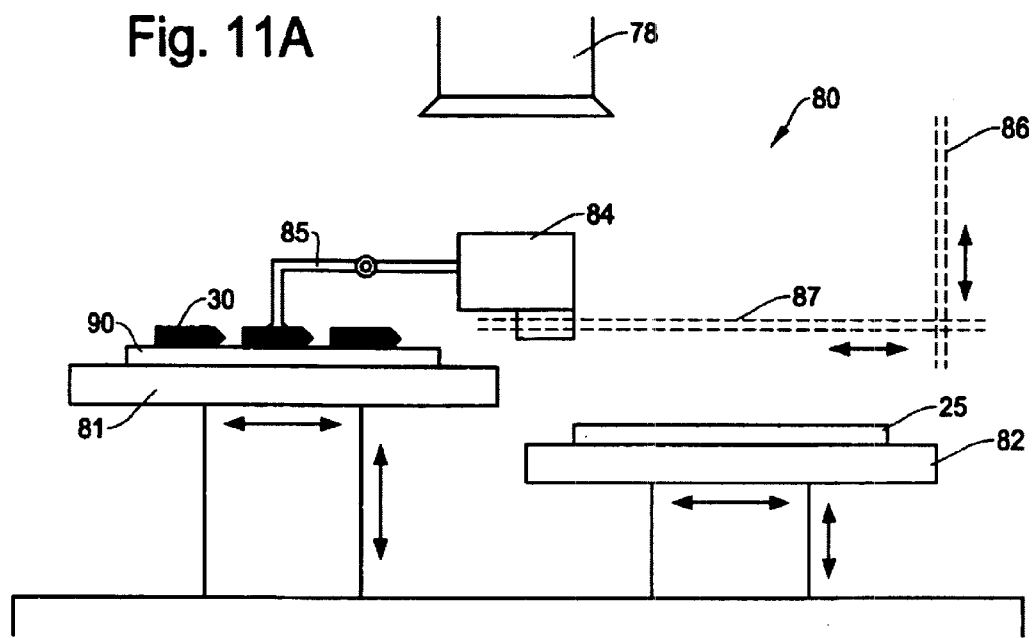
FIGS. 11A and 11B are schematic diagrams showing an example of pick and place mechanism and its process for picking the contactors and placing the same on a contactor carrier to produce the contact structure of the present invention.
Figure 11B:
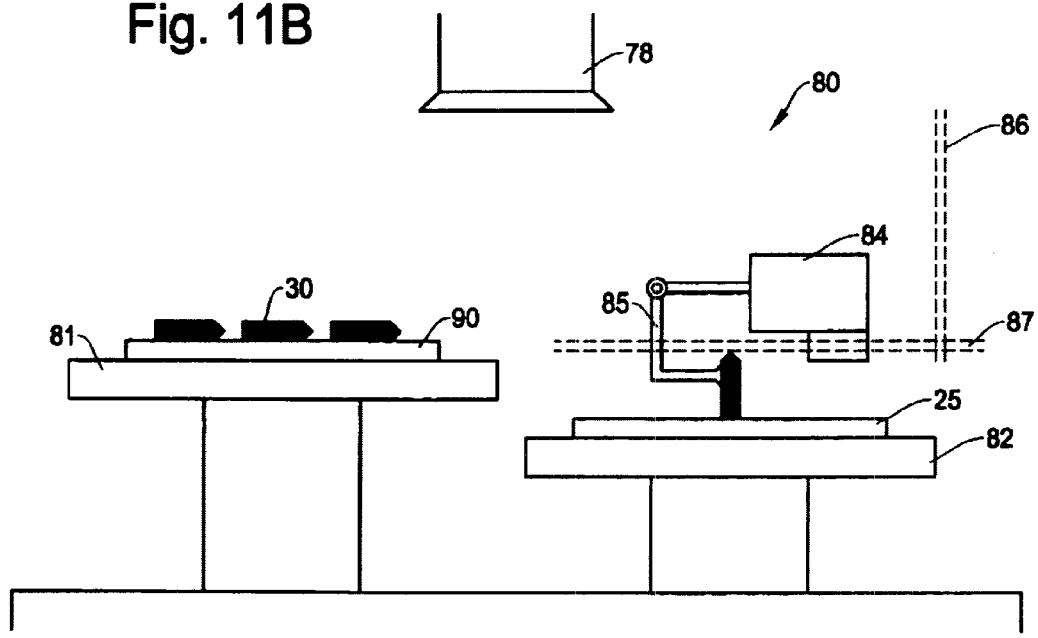

FIGS. 11A and 11B are schematic diagrams showing an example of process for picking the contactors 30 from the adhesive tape 90 and placing the contactors on the contactor carrier 20. The pick and place mechanism of FIGS. 11A and 11B is advantageously applied to the contactors produced by the production process of the present invention described with reference to FIGS. 9A–9D and FIGS. 10A–10N involving the adhesive tape. FIG. 11A is a front view of the pick and place mechanism 80 showing the first half process of the pick and place operation. FIG. 11B is a front view of the pick and place mechanism 80 showing the second half process of the pick and place operation.

In this example, the pick and place mechanism 80 is comprised of a transfer mechanism 84 to pick and place the contactors 30, mobile arms 86 and 87 to allow movements of the transfer mechanism 84 in X, Y and Z directions, tables 81 and 82 whose positions are adjustable in X, Y and Z directions, and a monitor camera 78 having, for example, a CCD image sensor therein. The transfer mechanism 84 includes a suction arm 85 that performs suction (pick operation) and suction release (place operation) operations for the contactors 30. The suction force is created, for example, by a negative pressure such as vacuum. The suction arm 85 rotates in a predetermined angle such as 90 degrees.

In operation, the adhesive tape 90 having the contactors 30 and the contactor adapter 25 having the grooves 27 (FIG. 12) are positioned on the respective tables 81 and 82 on the pick and place mechanism 80. As shown in FIG. 11A, the transfer mechanism 80 picks the contactor 30 from the adhesive tape 90 by suction force of the suction arm 85. After picking the contactor 30, the suction arm 85 rotates by 90 degrees, for example, as shown in FIG. 11B. Thus, the orientation of the contactor 30 is changed from the horizontal direction to the vertical direction. This orientation change mechanism is just an example, and a person skilled in the art knows that there are many other ways to change the orientation of the contactors. The transfer mechanism 80 then places the contactor 30 on the contactor adapter 25. The contactor adapter is then inserted in the contactor carrier 20.

FIGS. 12A–12D are schematic diagrams showing the process to securely assemble the contactors 30 to the carrier 20 using the contactor adapter 25. As shown in FIG. 12A, the contactOr 30 is provided with the cut-outs (indentations, or recesses) 39 at both sides of the upper portion thereof. The cut-out 39 has a predetermined length (distance between the upper end 33 and the stopper 38) to be securely attached to the contactor adapter 25. The length of the cut-out 39 is equal to the thickness of the contactor adapter 25.

The contactor adapter 25 is provided with grooves 27 and an adapter stopper 26 as shown in FIG. 12B. The cut-outs 39 of the contactor 30 and the grooves 27 of the contactor adapter 25 are produced so that they will snugly fit to one another. Namely, the width and thickness of the cut-outs 39 of the contactor 30 are made identical to the width and thickness of the groove 27 on the contactor adapter 25. Further, the distance between the upper end 33 and the stopper 38 of the contactor, i.e., the length of the cut-out 39, is made identical to the thickness of the contactor adapter 25. The contactor adapter 25 has an adapter stopper (step) 26 for mounting the contactor adapter 25 in the contactor carrier 20.

In FIG. 12C, the contactors 30 are mounted on the contactor adapter 25 by fitting the cut-outs 39 in the grooves 27. In other words, inner walls of the grooves 27 fit in the cut-outs 39 when the contactors 30 are mounted. When mounted, the contactor adapter 25 and the contactors 30 are flush with one another at the front surfaces in FIG. 12C. Adhesives (not shown) may be applied to the contactors 30 and the contactor adapter 25 to be securely fixed with each other.

In FIG. 12D, the contactor adapter 25 having the plurality of contactors 30 is inserted into the contactor carrier 20. In the example of FIG. 12D, the contactor carrier 20 has a plurality of slots 24 to receive the contactor adapters 25 mounted with the contactors 30. Each slot has a step (stopper) 28 to engage with the adapter stopper 26 of the contactor adapter 25. By inserting the contactor adapter 25 with the contactors 30 into the slot 24 of the contactor carrier 20, the contactors 30 and the contactor carrier 20 are securely and easily assembled with one another. The adapter stopper 26 of the contactor adapter 25 contacts with the step 28 formed in the slot 24, thereby determining the vertical position of the contactors 30.

Figure 1:
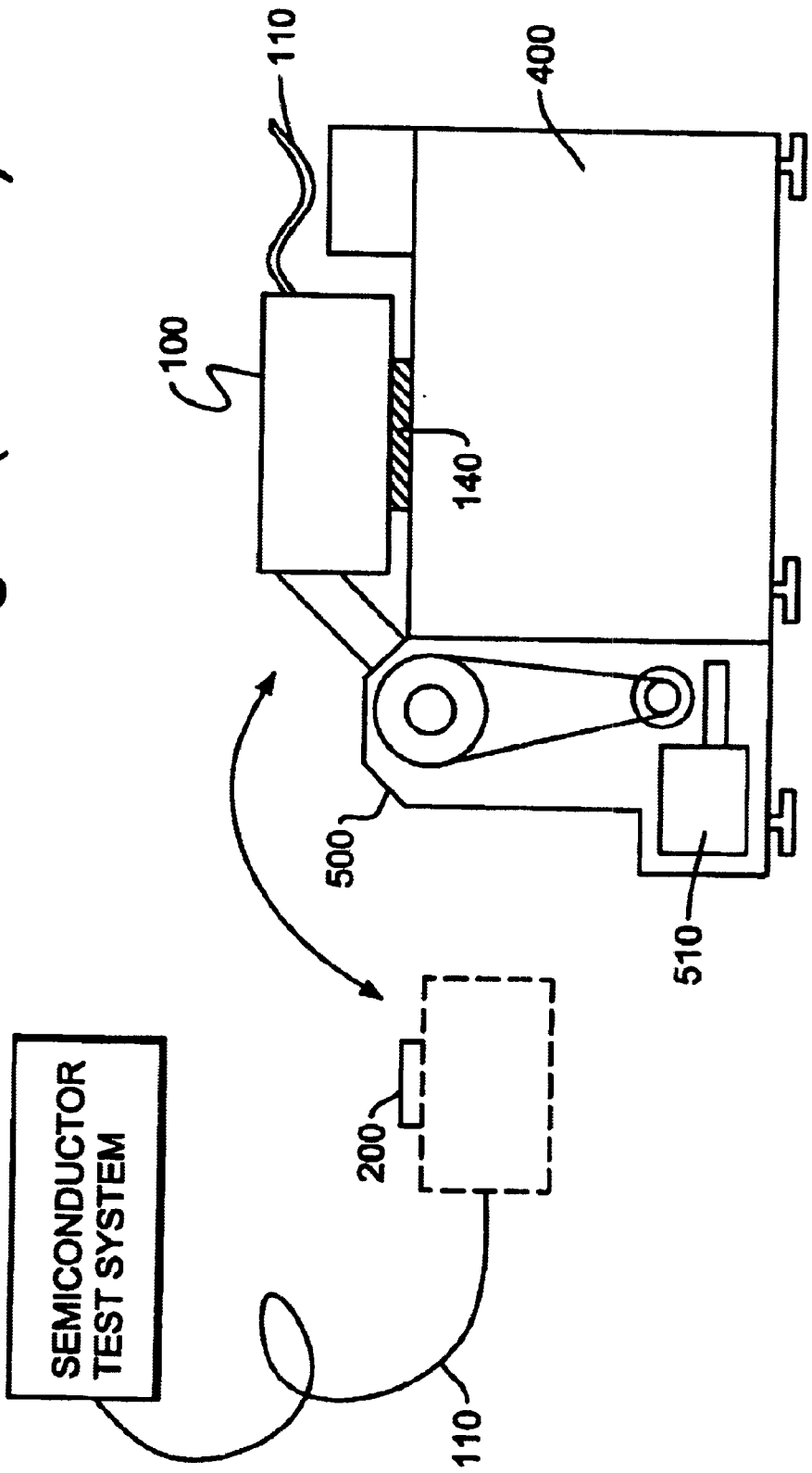
FIG. 1 is a schematic diagram showing a structural relationship between a substrate handler and a semiconductor test system having a test head.
Figure 2:
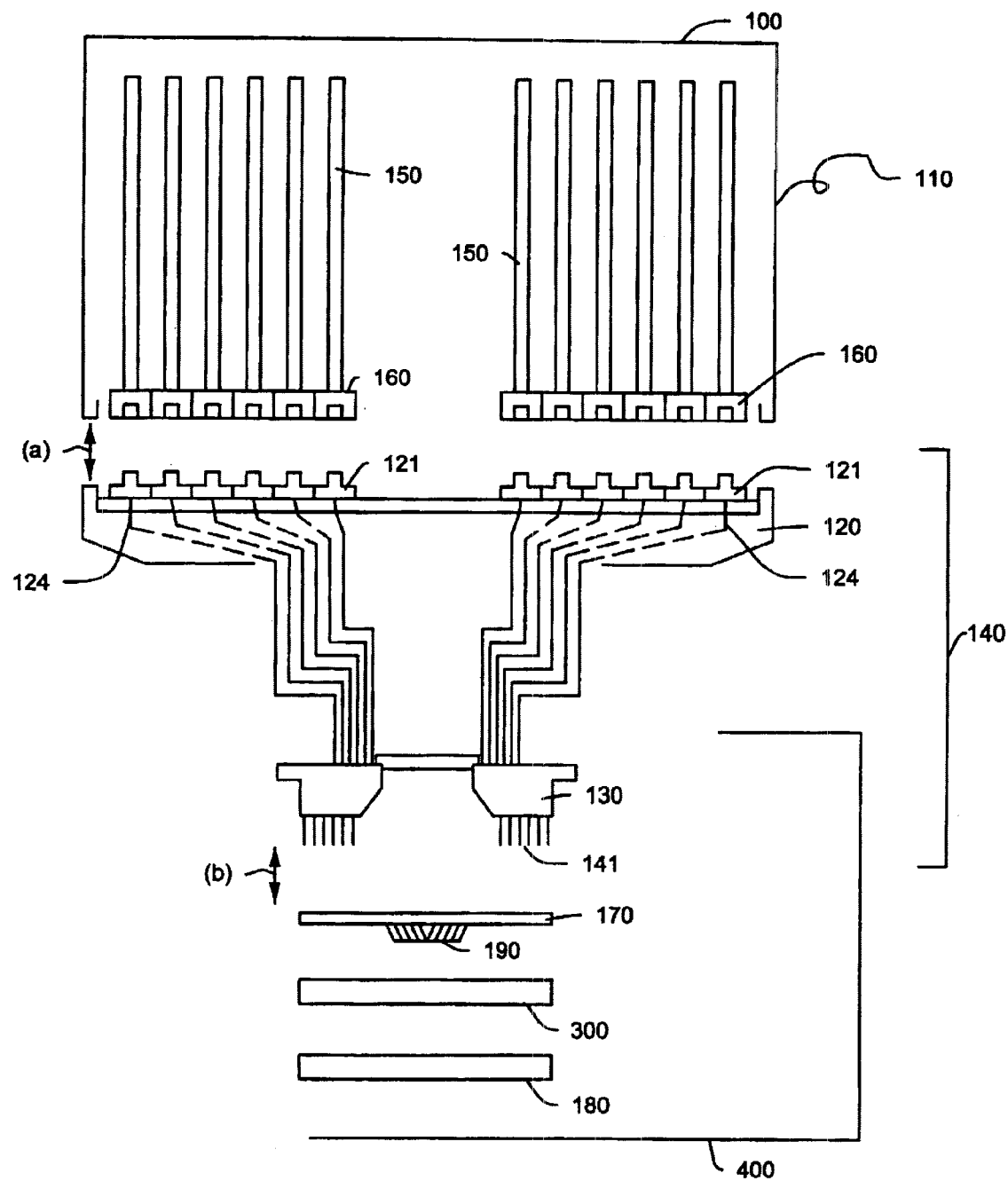
FIG. 2 is a diagram showing an example of more detailed structure for connecting the test head of the semiconductor test system to the substrate handler through an interface component.
Figure 13:
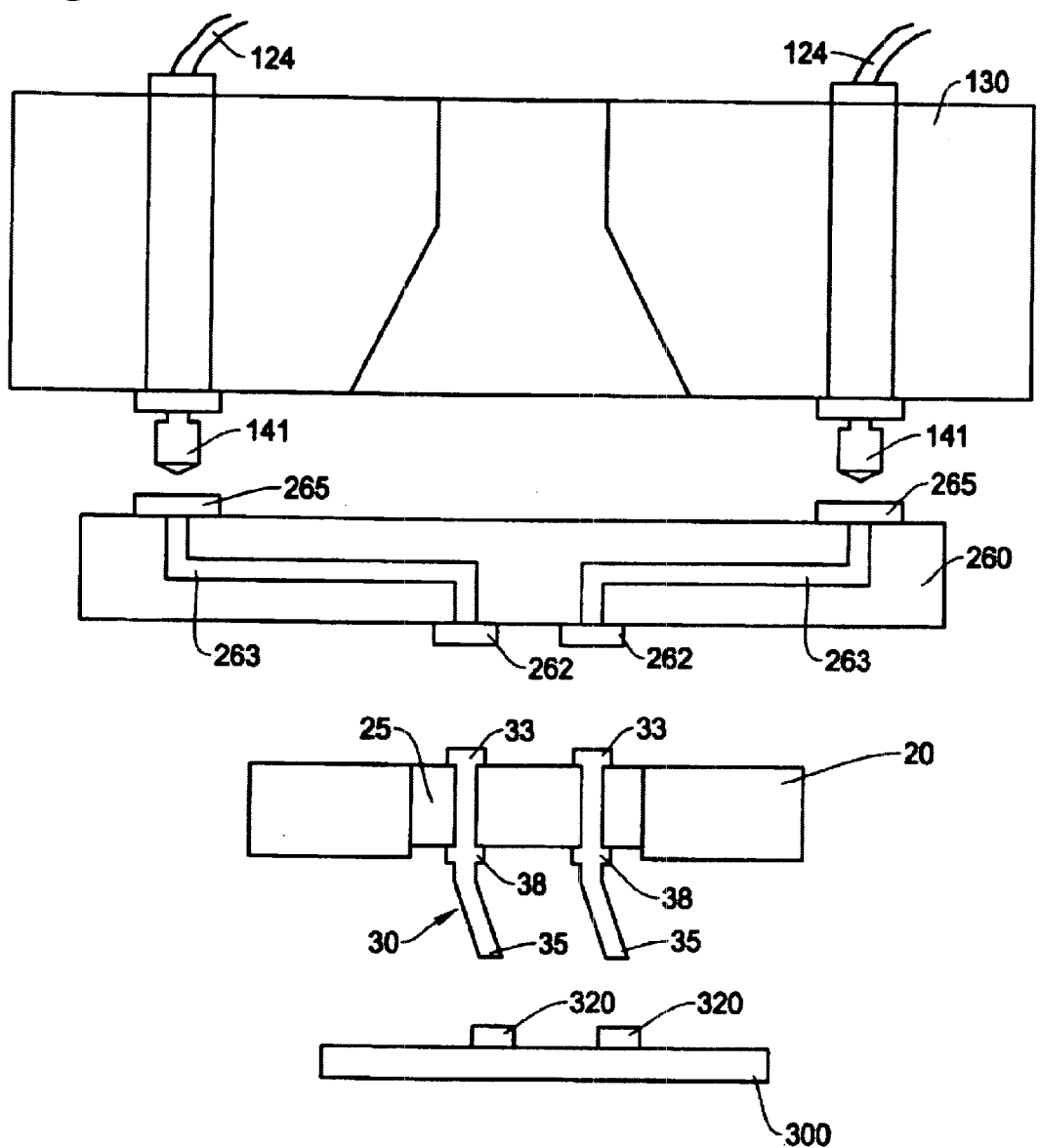
FIG. 13 is a cross sectional view showing an example of probe contact assembly using the contact structure of the present invention for use as an interface between a semiconductor device under test and a test head of a semiconductor test system.

FIG. 13 is a cross sectional view showing an example of total stack-up structure for forming a probe contact assembly using the contact structure of the present invention. The probe contact assembly is used as an interface between the device under test (DUT) and the test head of the semiconductor test system such as shown in FIG. 2. In this example, the probe contact assembly includes a routing board (probe card) 260, and a pogo-pin block (frog ring) 130 provided over the contact structure in the order shown in FIG. 13.

The contact structure is configured by a plurality of contactors 30 mounted on the contactor carrier 20. The upper end (base portion) 33 of each of the contactors 30 is projected at the upper surface of the contactor carrier 20. The lower end (contact portion) 35 is projected from the lower surface of the contactor carrier 20. The contactors 30 are inserted in the slots 24 on the contactor carrier 20 via the contactor adapter 25. As noted above, the diagonal (spring) portion 32 extends in a diagonal direction between the upper end 33 and the lower end 35. The diagonal portion 32 produces a resilient force when pressed against the semiconductor wafer 300.

The probe card 260, pogo-pin block 130 and contact structure are mechanically as well as electronically connected with one another, thereby forming a probe contact assembly. Thus, electrical paths are created from the contact point of the contactors 30 to the test head 100 through the cables 124 and performance board 120 (FIG. 2). Thus, when the semiconductor wafer 300 and the probe contact assembly are pressed with each other, electrical communication will be established between the DUT (contact pads 320 on the wafer 300) and the test system.

The pogo-pin block (frog ring) 130 is equivalent to the one shown in FIG. 2 having a large number of pogo-pins to interface between the probe card 260 and the performance board 120. At upper ends of the pogo-pins, cables 124 such as coaxial cables are connected to transmit signals to printed circuit boards (pin electronics cards) 150 in the test head 100 in FIG. 2 through the performance board 120. The probe card 260 has a large number of electrodes 262 and 265 on the upper and lower surfaces thereof.

When assembled, the upper ends 33 of the contactors 30 contact the electrodes 262. The electrodes 262 and 265 are connected through interconnect traces 263 to fan-out the pitch of the contact structure to meet the pitch of the pogo-pins in the pogo-pin block 130. Because the contactors 30 mounted on the contactor carrier 20 have the diagonal portions 32, the contactors 30 deform easily and produce resilient contact forces toward the contact pads 320 when pressed against the semiconductor wafer 300.

Figure 14:
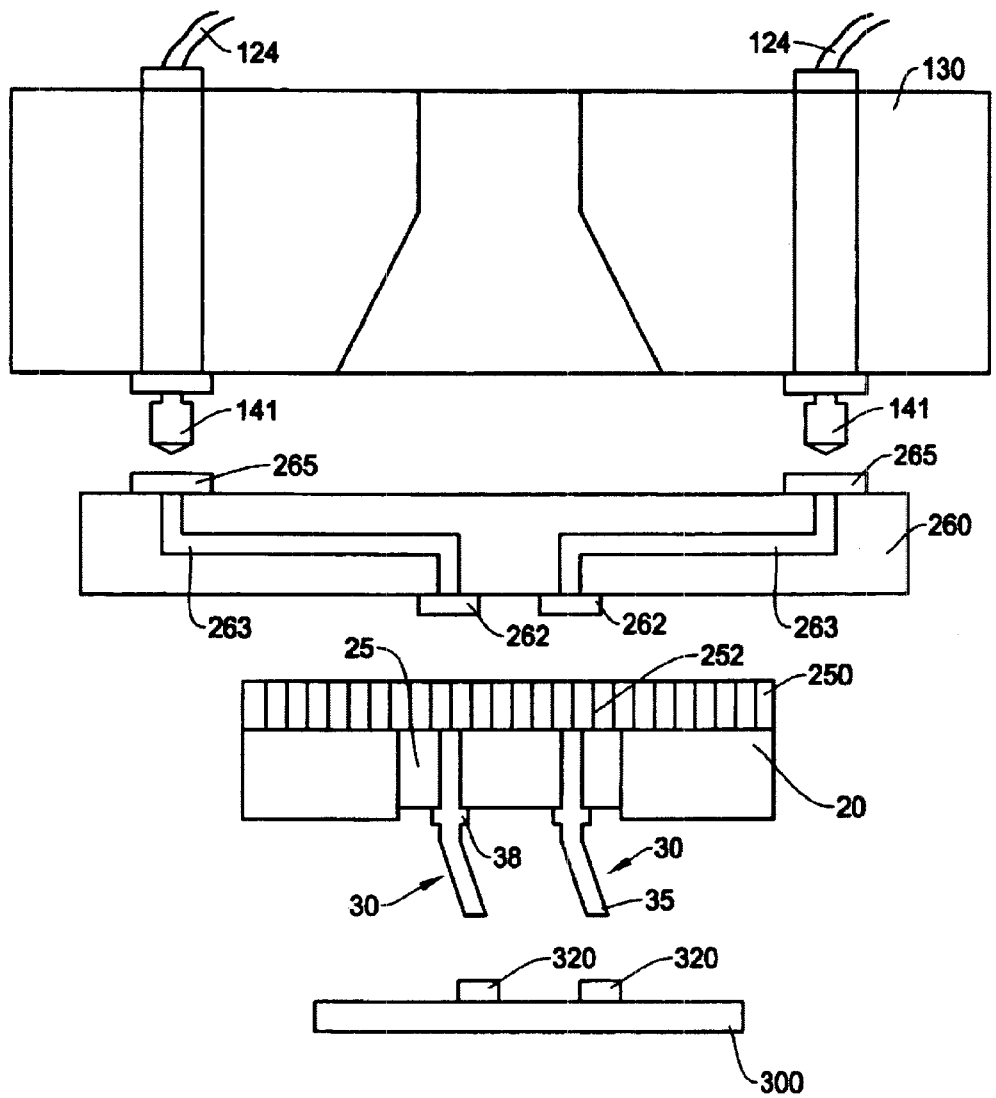
FIG. 14 is a cross sectional view showing another example of probe contact assembly using the contact structure of the present invention for use as an interface between the semiconductor device under test and a test head of the semiconductor test system.

FIG. 14 is a cross sectional view showing another example of probe contact assembly using the contact structure of the present invention. The probe contact assembly is used as an interface between the device under test (DUT) and the test head such as shown in FIG. 2. In this example, the probe contact assembly includes a conductive elastomer 250, a probe card 260, and a pogo-pin block (frog ring) 130 provided over the contact structure. Since the contactor 30 has the diagonal beam (spring) portion as mentioned above, such a conductive elastomer is usually unnecessary. However, the conductive elastomer may be still useful for compensating the unevenness of the gaps (planarity) between the probe card 260 and the contact structure.

The conductive elastomer 250 is provided between the contact structure and the probe card 260. When assembled, the upper ends 33 of the contactors 30 contact the conductive elastomer 250. The conductive elastomer 250 is an elastic sheet having a large number of conductive wires in a vertical direction. For example, the conductive elastomer 250 is comprised of a silicon rubber sheet and a multiple rows of metal filaments. The metal filaments (wires) are provided in the vertical direction of FIG. 14, i.e., orthogonal to the horizontal sheet of the conductive elastomer 250. An example of pitch between the metal filaments is 0.05 mm or less and thickness of the silicon rubber sheet is about 0.2 mm. Such a conductive elastomer is produced by Shin-Etsu Polymer Co. Ltd, Japan, and available in the market.

According to the present invention, the contact structure has a very high frequency bandwidth to meet the test requirements of next generation semiconductor technology. The contact structure is formed easily and securely by mounting the contactors on the contactor carrier through the contactor adapter. Since the large number of contactors are produced at the same time on the substrate without involving manual handling, it is possible to achieve consistent quality, high reliability and long life in the contact performance.

Although only a preferred embodiment is specifically illustrated and described herein, it will be appreciated that many modifications and variations of the present invention are possible in light of the above teachings and within the purview of the appended claims without departing the spirit and intended scope of the invention.

What is claimed is:

1. A contact structure for establishing electrical connection with contact targets, comprising:
   a plurality of contactors made of conductive material where each of the contactors is comprised of an upper end oriented in a vertical direction and has a cut-out for achieving a lock mechanism, a lower end oriented in a direction opposite to the upper end and functions as a contact point for electrical connection with a contact target, and a diagonal portion provided between the upper end and the lower end to function as a spring;
   a contactor adapter having a plurality of grooves running in a direction vertical with a surface thereof for mounting the contactors on the contactor adapter; and
   a contactor carrier having a slot for mounting the plurality of contactors when the contactor adapter having the contactors is inserted therein;
   wherein said cut-out creates a recess on the contactor with a length equal to a thickness of said contactor adapter so that an inner wall of the groove of the contactor adapter fits in said cut-out, and wherein said upper end of each contactor is projected from said upper surface of said contactor carrier and said lower end of each contactor is projected from said lower surface of said contactor carrier.

2. A contact structure for establishing electrical connection with contact targets as defined in claim 1, wherein the contactor further includes a stopper which contacts a bottom surface of the contactor adapter when the contactor is mounted on the contactor adapter, and wherein the cut-out is formed between the upper end and the stopper of the contactor.

3. A contact structure for establishing electrical connection with contact targets as defined in claim 1, wherein a thickness of the cut-out of the contactor and a depth of the groove on the contactor adapter match with one another so that surfaces of the contactors and the contactor adapter are flush with one another when the contactors are fit in the grooves.

4. A contact structure for establishing electrical connection with contact targets as defined in claim 1, wherein the cut-out is formed at both sides of the contactor and a width between the cut-outs of the contactor is substantially the same as a width of the groove of the contactor adapter.

5. A contact structure for establishing electrical connection with contact targets as defined in claim 1, wherein the cut-out is formed at one side of the contactor and a width of the contactor at the cut-out is substantially the same as a width of the groove of the contactor adapter.

6. A contact structure for establishing electrical connection with contact targets as defined in claim 1, wherein the contactor adapter further includes an adapter stopper which engages with a step formed in the slot of the contactor carrier to determine a vertical position of the contactors when the contactor adapter is inserted in the slot.

7. A contact structure for establishing electrical connection with contact targets as defined in claim 1, wherein the diagonal portion of the contactor has a width smaller than that of the upper end of the contactor, thereby resiliently deformed when the contact structure is pressed against the contact target.

8. A contact structure for establishing electrical connection with contact targets as defined in claim 1, wherein the contactor carrier and the contactor adapter are made of silicon or dielectric material such as polyimide, ceramic and glass.

9. A method for producing a contact structure, comprising the following steps of:
   (a) forming a sacrificial layer on a surface of a base substrate;
   (b) forming a photoresist layer on the sacrificial layer;
   (c) aligning a photo mask over the photoresist layer and exposing the photoresist layer through the photo mask, the photo mask including an image of the contactors;
   (d) developing patterns of the image of the contactors on a surface of the photoresist layer;
   (e) forming the contactors made of conductive material in the patterns on the photoresist layer by depositing the conductive material, each of the contactors having an upper end with a cut-out for achieving a lock mechanism, a lower end oriented in a direction opposite to the upper end to function as a contact point, and a diagonal beam portion provided between the upper end and the lower end to function as a spring;
   (f) stripping the photoresist layer off;
   (g) removing the sacrificial layer so that the contactors are separated from the base substrate;
   (h) attaching the contactors to a contactor adapter having grooves thereon wherein said cut-out creates a recess on the contactor with a length equal to a thickness of said contactor adapter so that an inner wall of the groove of the contactor adapter fits in said cut-out; and (i) mounting the contactor adapter having the contactors on a contactor carrier by inserting the contactor adapter in a slot on the contactor carrier, thereby forming the lock mechanism.

10. A method for producing a contact structure as defined in claim 9, after forming the contactors by depositing the conductive material and stripping off the photoresist layer, the method further comprising a step of placing an adhesive tape on the contactors so that upper surfaces of the contactors are attached to the adhesive tape.

11. A method for producing a contact structure as defined in claim 10, said step of attaching the contactors to the contactor adapter including a step of picking the contactor from the adhesive tape and changing an orientation of the contactor and attaching the contactor to the contactor adapter with use of a pick and place mechanism which utilizes a suction force to attract the contactor.

12. A method for producing a contact structure, comprising the following steps of:

(a) forming an conductive substrate made of electric conductive material on a base substrate;

(b) forming a photoresist layer on the conductive substrate;

(c) aligning a photo mask over the photoresist layer and exposing the photoresist layer through the photo mask, the photo mask including an image of the contactors;

(d) developing patterns of the image of the contactors on a surface of the photoresist layer;

(e) forming the contactors made of conductive material in the patterns on the photoresist layer by depositing the conductive material, wherein each of the contactors having an upper end with a cut-out for achieving a lock mechanism, a lower end oriented in a direction opposite to the upper end to function as a contact point, and a diagonal beam portion provided between the upper end and the lower end to function as a spring;

(f) stripping off the photoresist layer;

(g) peeling the conductive substrate having contactors thereon from the base substrate;

(h) placing an adhesive tape on the contactors on the conductive substrate so that upper surfaces of the contactors adhere to the adhesive tape wherein adhesive strength between the contactors and the adhesive tape is larger than that between the contactors and the conductive substrate;

(i) peeling the conductive substrate so that the contactors on the adhesive tape are separated from the conductive substrate;

(j) attaching the contactors to a contactor adapter having grooves thereon wherein said cut-out creates a recess on the contactor with a length equal to a thickness of said contactor adapter so that an inner wall of the groove of the contactor adapter fits in said cut-out; and (k) mounting the contactor adapter having the contactors on a contactor carrier by inserting the contactor adapter in a slot on the contactor carrier, thereby forming the lock mechanism.

13. A probe contact assembly for establishing electrical connection with contact targets, comprising:

a contactor carrier having a contactor adapter inserted in a slot where a plurality of contactors are mounted on the contactor adapter;

a probe card for mounting the contactor carrier and establishing electrical communication between the contactors and electrodes provided on the probe card; and a pin block having a plurality of contact pins to interface between the probe card and a semiconductor test system when the pin block is attached to the probe card;

wherein each of the contactors is comprised of an upper end oriented in a vertical direction and has the cut-out for being fitted in the groove on the contactor adapter, a lower end oriented in a direction opposite to the upper end and functions as a contact point for electrical connection with a contact target, and a diagonal portion provided between the upper end and the lower end to function as a spring and wherein said cut-out creates a recess on the contactor with a length equal to a thickness of said contactor adapter so that an inner wall of the groove of the contactor adapter fits in said cut-out.

14. A probe contact assembly for establishing electrical connection with contact targets as defined in claim 13, wherein the contactor further includes a stopper which contacts a bottom surface of the contactor adapter when the contactor is mounted on the contactor adapter, and wherein the cut-out is formed between the upper end and the stopper of the contactor.

15. A probe contact assembly for establishing electrical connection with contact targets as defined in claim 13, wherein a thickness of the cut-out of the contactor and a depth of the groove on the contactor adapter match with one another so that surfaces of the contactors and the contactor adapter are flush with one another when the contactors are fit in the grooves.

16. A probe contact assembly for establishing electrical connection with contact targets as defined in claim 13, wherein the cut-out is formed at both sides of the contactor and a width between the cut-outs of the contactor is substantially the same as a width of the groove of the contactor adapter.

17. A probe contact assembly for establishing electrical connection with contact targets as defined in claim 13, wherein the cut-out is formed at one side of the contactor and a width of the contactor at the cut-out is substantially the same as a width of the groove of the contactor adapter.

18. A probe contact assembly for establishing electrical connection with contact targets as defined in claim 13, wherein the contactor adapter further includes an adapter stopper which engages with a step formed in the slot of the contactor carrier to determine a vertical position of the contactors when the contactor adapter is inserted in the slot.

* * * * *